(12) United States Patent
Zhou et al.

(10) Patent No.: US 8,654,880 B2
(45) Date of Patent: Feb. 18, 2014

(54) DATA TRANSMISSION USING LOW DENSITY PARITY CHECK CODING AND CONSTELLATION MAPPING

(75) Inventors: Wei Zhou, Beijing (CN); Li Zou, Shangal (CN); Yuping Zhao, Beijing (CN); Xiaoxin Zhang, Beijing (CN); Peng Liu, Beijing (CN); Charles Chuanming Wang, Philadelphia, PA (US)

(73) Assignee: Thomson Licensing, Issy les Moulineaux (FR)

( * ) Notice: Subject to any disclaimer, the term of this patent is extended or adjusted under 35 U.S.C. 154(b) by 140 days.

(21) Appl. No.: 13/388,810

(22) PCT Filed: Jul. 20, 2010

(86) PCT No.: PCT/US2010/002040
§ 371 (c)(1),
(2), (4) Date: Feb. 3, 2012

(87) PCT Pub. No.: WO2011/016835
PCT Pub. Date: Feb. 10, 2011

(65) Prior Publication Data
US 2012/0134423 A1 May 31, 2012

(30) Foreign Application Priority Data
Aug. 7, 2009 (EP) .................................... 09305740

(51) Int. Cl.
*H04B 7/02* (2006.01)
(52) U.S. Cl.
USPC ........... 375/267; 375/259; 375/260; 375/295; 375/332; 375/340
(58) Field of Classification Search
None
See application file for complete search history.

(56) References Cited

U.S. PATENT DOCUMENTS

| 7,411,928 B2 | 8/2008 | Ghosh et al. |
| 7,577,207 B2 * | 8/2009 | Eroz et al. ................ 375/261 |

(Continued)

FOREIGN PATENT DOCUMENTS

| CN | 1954510 A | 4/2007 |
| JP | 200346586 | 2/2003 |

(Continued)

OTHER PUBLICATIONS

Suzuki et al., "Reduced Cluster Search ML Decoding for QO-STBC Systems", 2009 First International Conference on Advances in Satellite and Space Communications, Jul. 20, 2009, pp. 48-53.

(Continued)

*Primary Examiner* — Hirdepal Singh
(74) *Attorney, Agent, or Firm* — Robert D. Shedd; Vincent E. Duffy; Michael A. Pugel

(57) ABSTRACT

Modern coding and modulation techniques have greatly improved the transmission of signals. A method is described including receiving a stream of data bits, demultiplexing the stream into a first and second substream, encoding the first and second substream using a low density parity check coding process, and mapping the first substream to a first region of a symbol constellation map and the second substream to a second region. Also, an apparatus is described including a demultiplexer that produces a first and second bitstream, a first encoder that encodes the first substream using a low density parity check coding process at a first encoding rate, a second encoder that encodes the second substream at a second rate, and a symbol mapper that maps bits from the first substream to a first region of a symbol constellation map and maps bits from the second substream to a second region.

18 Claims, 9 Drawing Sheets

(56) References Cited

U.S. PATENT DOCUMENTS

| | | | |
|---|---|---|---|
| 7,796,696 B2 * | 9/2010 | Hansen et al. | 375/260 |
| 8,051,355 B2 | 11/2011 | Taubin et al. | |
| 8,448,053 B2 | 5/2013 | Landau et al. | |
| 2003/0138056 A1 | 7/2003 | Uesugi et al. | |
| 2005/0185730 A1 | 8/2005 | Hansen et al. | |
| 2005/0283708 A1 | 12/2005 | Kyung et al. | |
| 2007/0098092 A1 * | 5/2007 | Mitran | 375/260 |
| 2007/0217541 A1 | 9/2007 | Liu et al. | |
| 2008/0104474 A1 | 5/2008 | Gao et al. | |
| 2008/0107202 A1 * | 5/2008 | Lee et al. | 375/267 |
| 2008/0163025 A1 | 7/2008 | Djordjevic et al. | |
| 2008/0232489 A1 * | 9/2008 | Tsai et al. | 375/260 |
| 2009/0052907 A1 | 2/2009 | Batshon et al. | |
| 2009/0125780 A1 * | 5/2009 | Taylor et al. | 714/752 |
| 2009/0125781 A1 | 5/2009 | Jeong et al. | |
| 2010/0003934 A1 * | 1/2010 | Visoz et al. | 455/115.3 |
| 2010/0027688 A1 | 2/2010 | Suh et al. | |
| 2010/0050043 A1 | 2/2010 | Savin | |
| 2010/0050048 A1 * | 2/2010 | Djordjevic et al. | 714/755 |
| 2010/0088573 A1 | 4/2010 | Lakkis | |
| 2010/0226415 A1 * | 9/2010 | Mehta et al. | 375/219 |
| 2010/0257426 A1 | 10/2010 | Yokokawa et al. | |
| 2010/0275101 A1 * | 10/2010 | Yokokawa et al. | 714/763 |
| 2010/0303167 A1 * | 12/2010 | Juang et al. | 375/267 |

FOREIGN PATENT DOCUMENTS

| | | | |
|---|---|---|---|
| JP | 2008526163 | 7/2008 | |
| JP | 2008527931 | 7/2008 | |
| WO | WO2006076599 | 7/2006 | |
| WO | WO 2008031951 A2 * | 3/2008 | H04B 7/04 |
| WO | WO2008071884 | 6/2008 | |
| WO | WO2009069617 | 6/2009 | |

OTHER PUBLICATIONS

Von Deetzen et al.,"Unequal Error Protection Multilevel Codes and Hierarchical Modulation for Muitimedia Transmission", IEEE International Symposium on Information Theory, Jul. 6, 2008, pp. 2237-2241.

Search Report Dated Aug. 30, 2010.

Henk Wymeersch et al. "Acoustics, Speech and Signal Processing, 2004"., IEEE International Conference, vol. 4, pp. 669-672.

Shigeru Uchida, etal., "Construction Method and Mapping Method of LDPC Codes for M-ary QAM", IEICE Technical Report, vol. 105, No. 196, pp. 7-12.

Neele von Deetzen et al., "Unequal Error Protection Multilevel Codes and Hierarchial Mod for Multimedia Transmission", IEEE Intern. Symposium on Information Theroy, IEEE, pp. 2237-2241.

* cited by examiner

DATA TRANSMISSION USING LOW DENSITY PARITY CHECK CODING AND CONSTELLATION MAPPING

This application claims the benefit, under 35 U.S.C. §365 of International Application PCT/US10/002040, filed Jul. 20, 2010, which was published in accordance with PCT Article 21(2) on Feb. 10, 2011 in English and which claims the benefit of European patent application No. 09305740.4, filed Aug. 7, 2009.

FIELD OF THE INVENTION

The present disclosure relates generally to the transmission and reception of data in a multicarrier transmission signal and more specifically to the encoding of a broadcast signal, such as an Orthogonal Frequency Division Multiplexing (OFDM) digital television signal, using parity check coding and constellation mapping.

BACKGROUND OF THE INVENTION

This section is intended to introduce the reader to various aspects of art, which may be related to various aspects of the present disclosure that are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Digital television signal systems represent the new generation of television broadcasting, employing digital signal processing in signal generation, signal transmission, signal reception, and customer display. Globally, several standards for digital television signal transmission have been employed including the Advanced Televisions Systems Committee (ATSC) standard predominantly in the United States and the Digital Video Broadcast—Terrestrial (DVB-T) standard predominantly in Europe and other parts of the world. A variant of DVB-T, known as DVB-Handheld (DVB-H) is a standard for application in small handheld and mobile devices based on the DVB-T standard. Both DVB-T and DVB-H use OFDM as the modulation layer format technology.

OFDM is a robust technique for efficiently transmitting data over a channel. The technique uses a plurality of sub-carrier frequencies (sub-carriers) within a channel bandwidth to transmit data. These sub-carriers are arranged for optimal bandwidth efficiency, as compared to conventional frequency division multiplexing (FDM) which can waste portions of the channel bandwidth in order to separate and isolate the sub-carrier frequency spectra and thereby avoid inter-carrier interference (ICI). By contrast, although the frequency spectra of OFDM sub-carriers overlap significantly within the OFDM channel bandwidth, OFDM nonetheless allows resolution and recovery of the information that has been modulated onto each sub-carrier.

An OFDM transmission system, such as is used in DVB-T and DVB-H, modulates a high-rate data stream onto a number of parallel carriers to be transmitted simultaneously as a number of sub-carriers. In the transmitter, the data bits are modulated on the sub-carriers using either a phase shift keying (PSK) or quadrature amplitude modulation (QAM) constellation mapping. The OFDM system may also use a concatenated encoding process employing an outer encoding process residing nearer to the data source in the processing chain and an inner encoding process residing nearer to the signal modulation and transmission.

Advances in error correction systems used as part of the signal coding process have allowed further improvement in signal transmission performance, particularly when coupled with transmission systems such as OFDM. One such error correction system is known as Low-density parity-check (LDPC) coding. LDPC codes are generally recognized as Shannon limit approaching codes, particularly when used with longer code lengths. As a result, LDPC encoding may be used in many signal transmission systems, including concatenated signal coding systems, such as DVB-T and DVB-H.

LDPC coding may not provide optimal coding performance when used with certain signal transmission systems. In particular, LDPC coding may not produce optimal coding performance when used with higher order modulation constellation mapping, such as 16 level quadrature amplitude modulation (16-QAM), 64-QAM, and 256-QAM. The performance degradation may be due to the relationship between the relative reliability of the symbols within the modulation constellation and the error protection provided to the data mapped to each of the symbols. Proposals for improvement exist, including multistage decoding at the receiver and bit interleaved coding of the symbols in the constellation. However, these solutions are limited in capability and, as a result, do not fully address the issues with higher order modulation and LDPC coding. Therefore, it is desirable to create an apparatus and method for LDPC coding and symbol mapping process to improve the capabilities of LDPC coding and higher order modulation formats.

SUMMARY OF THE INVENTION

In accordance with an aspect of the present disclosure, an apparatus for transmitting signals is described including a demultiplexer that receives a stream of data arranged in bits and produces a first substream of data containing a portion of the stream of data and a second substream of data containing a second portion of the stream of data, a first encoder, coupled to the demultiplexer, that encodes the first substream using a low density parity check coding process at a first encoding rate, a second encoder, coupled to the demultiplexer, that encodes the second substream using a low density parity check coding process at a second encoding rate, and a symbol mapper, coupled to the first encoder and the second encoder, that maps a set of bits from the first encoded substream to a first region of a symbol constellation map and maps a set of bits from the second encoded substream to a second region of the symbol constellation map to produce a set of symbols.

In accordance with another aspect of the present disclosure, a method for transmitting signals is described, including the steps of demultiplexing a stream of data bits into a first substream containing a first portion of the stream of data bits and a second substream containing a second portion of the stream of data bits, encoding the first substream and the second substream using a low density parity check coding process, and mapping a set of bits from the first encoded substream to a first region of a symbol constellation map and a set of bits from the second coded substream to a second region of the symbol constellation map.

In accordance with yet another aspect of the present disclosure, an apparatus for encoding signals is described including means for demultiplexing a stream of data bits into a first substream containing a first portion of the stream of data bits and a second substream containing a second portion of the stream of data bits, means for encoding the first substream and the second substream using a low density parity check coding process; and means for mapping a set of bits from the first encoded substream to a first region of a symbol constellation map and a set of bits from the second coded substream to a second region of the symbol constellation map.

Figure 1:
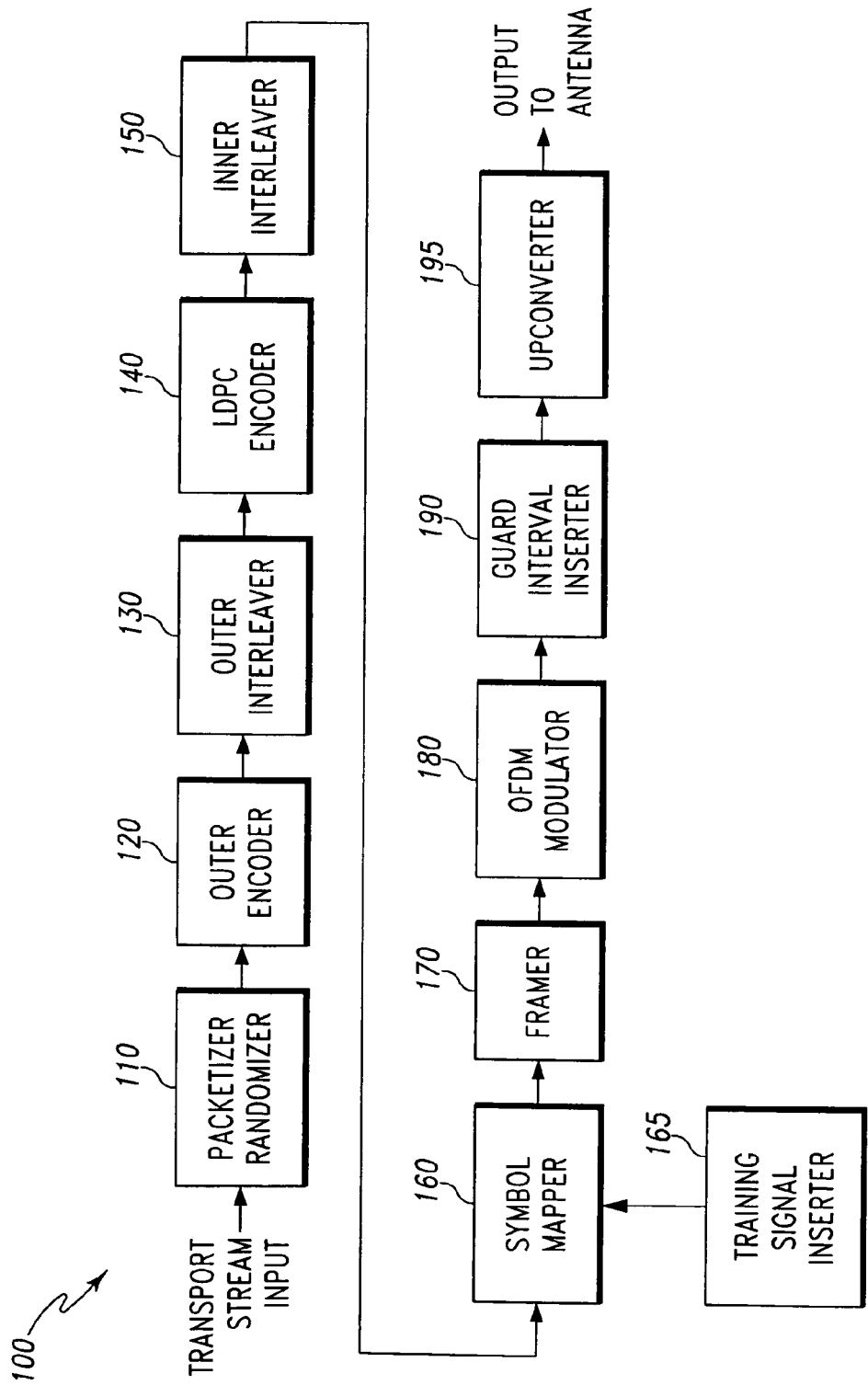
FIG. 1 is a block diagram of an embodiment of a transmitter according to aspects of the present disclosure.

The characteristics and advantages of the present disclosure may become more apparent from the following description, given by way of example.

DETAILED DESCRIPTION

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The following describes a system, including circuits and processes, used for transmitting and receiving signals in a broadcast signal environment such as DVB-T or DVB-H. Other systems utilized to transmit and receive other types of signals in other networks may include very similar structures. Those of ordinary skill in the art will appreciate that the embodiment of the circuits described herein is merely one potential embodiment. As such, in alternate embodiments, the components of the system may be rearranged or omitted, or additional components may be added based on particular attributes of the system. For example, with minor modifications, the circuits described may be configured for use in other wireless networks such as an Institute of Electrical and Electronics Engineers (IEEE) 802.11 wireless network. Further, the embodiments described may easily be combined with multiple input multiple output (MIMO) technology to improve the channel capacity.

The embodiments described below are primarily related to transmission and reception of signals. Certain aspects of the embodiments including, but not limited to, certain control signals and power supply connections have not been described or shown in the figures but may easily be ascertained by a skilled artisan. It should be noted that the embodiments may be implemented using hardware, software, or any combination of both, including the use of a microprocessor and program code or custom integrated circuits. It should also be noted that some of the embodiments may involve iterative operation and connection between the various elements of the embodiment. Alternative embodiments may be possible using pipelining architectures employing repeated identical elements connected in series, in place of, or in addition to, the iterative embodiments described herein.

The embodiments described below utilize a coded modulation signal transmission scheme using LDPC coding in conjunction with OFDM modulation and further in conjunction with a block coding process such as Reed-Solomon coding. In particular, embodiments describe the use of parallel LDPC coding, such as non-binary LDPC coding, for separate portions of a bitstream and symbol mapping processes tailored to the LDPC coding of the portions of the bitstream. The symbol mapping maps a set of bits from a first portion substream to a first region of a symbol constellation map and maps a set of bits from a second portion substream to a second region of the symbol constellation map to produce a set of symbols, overcoming the inherent inequity in bit reliability that occurs in portions of a typical higher order multi-symbol constellation map. The symbol mapping processes described include, but are not limited to, 16-QAM, 64-QAM, and 256-QAM modulation constellations. Implementation of one or more aspects of the embodiments offers the benefit of improved overall coding performance and improved coding efficiency for a signal using higher order modulation formats.

Turning now to the drawings and referring initially to FIG. 1, a block diagram of an embodiment of a transmitter 100 using aspects of the present disclosure is shown. Transmitter 100 generally represents the operational aspects used for encoding and transmitting a broadcast signal using OFDM modulation. In a preferred embodiment, transmitter 100 encodes and transmits an OFDM signal signal to the OFDM signal transmitted based of the DVB-T transmission standard.

In transmitter 100, an input signal representing a transport stream is provided to packetizer/randomizer 110. The output of packetizer/randomizer 110 is connected to outer encoder 120. The output of outer encoder 120 is connected to outer interleaver 130. The output of outer interleaver is connected to LDPC encoder 140. The output of LPDC encoder 140 is connected to inner interleaver 150. The output of inner interleaver 150 is connected to symbol mapper 160. In addition, the output from a pilot and TPS inserter 165 is connected to the input of symbol mapper 160. The output of symbol mapper 160 is connected to framer 170. The output of framer 170 is connected to OFDM modulator 180. The output of OFDM modulator 180 is connected to guard interval inserter 190. The output of guard interval inserter 190 is connected to upconverter 195. The output of upconverter 195 is provided as an output for the transmission of the signal.

The input signal represents a continuous sequence of data bits representing one or more source encoded programs organized into a transport stream. The source encoding may be performed in a source coding block, not shown, and may include coding and compression algorithms for audio, video, or data content. In a preferred embodiment the audio and video compression and coding is performed using MPEG-2 compression. The transport stream is provided to packetizer/randomizer 110. Packetizer/randomizer 110 organizes portions of the incoming transport into packets. The packets may be variable length or may be a fixed length, such as 188 bytes. The organization of the incoming stream into packets permits error correction encoding bytes to be generated and appended to the packets. Packetizer/randomizer 110 also randomizes or decorrelates the incoming data packets in order prevent potential issues associated with non-random signal transmission. Packetizer/randomizer 110 may decorrelate the data in the data packets by multiplying each byte in the data packets by a second byte representing a random number value in a known random number sequence.

The decorrelated data stream of data packets is provided to the outer encoder 120. The outer encoder provides a first error correction to the data packets. Typically, the first error correction process uses a block encoding process that creates additional redundant, or parity, bytes or packets and appends those bytes or packets to the original data bytes or packets. The type of encoding process and the amount of redundant information that is added to the original data bytes or packets determines the amount of errors that can be corrected. In a preferred embodiment, the outer encoder 120 uses a Reed-Solomon encoding process that creates 26 parity bytes using the 188 bytes in each data packet to form a Reed-Solomon packet containing 204 bytes of data. The Reed-Solomon (204, 188) process is capable of correcting up to 8 byte errors in each packet. In addition, the outer encoder may also append additional bytes used for identification of the information contained in the data packet. For example, a 3 byte header containing information about the program stream content and source encoding rates may be added to the 204 byte Reed-Solomon packet.

The stream containing the outer encoded packets is provided to the outer interleaver 130. Outer interleaver 130 reorders or rearranges the bytes in the outer encoded packets in order to maintain the random nature of the signal. Outer interleaver 130 may use one of a number of known interleaving processes including, but not limited to, a fixed convolutional interleaving process or a fixed block interleaving process. The interleaving process and the pattern are known to both the transmitter and receiver. Convolutional interleaving, such as may be used by outer interleaver 130, rearranges the bytes in order to improve the ability of a receiver to recover from certain types of impairments in the transmission process. Convolutional interleaving may be optimized to improve reception in the presence of a short burst of interference to the signal during transmission or may alternately be optimized to improve the reception in the presence of a steady continuous form of interference to the signal. Outer interleaver 130 may include a memory for storing a portion of the incoming stream or a portion of the output interleaved stream in order to facilitate the interleaving process.

The outer interleaved packets are provided to the LDPC encoder 140. The LDPC encoder 140 encodes the outer interleaved packets using an LDPC encoding process. LDPC encoder 140 may use any known LDPC encoding processes including, but not limited to, LDPC algorithms based on a regrouping of bits using a Forney factor map and the creation of a generator matrix based on a sparse parity check matrix algorithm. For example, a sparse parity check matrix may be randomly generated and used to create a generator matrix, subject to a set of defined scarcity constraints associated with the input message length and the output code length. Further, the sparse parity check matrix may also be constructed using an algebraic method. For instance, for a given parity check matrix H, then the generator matrix G may be derived from the equation:

$$G \cdot H^T = 0 \quad (1)$$

LDPC encoder 140 may operate such that the encoding is performed directly on the incoming bits based on the equation:

$$C = I \cdot G \quad (2)$$

Where I is a set of bits in the bitstream which will be encoded and C is the code word, or set of bits, resulting from the encoding process. It is important to note that in the decoding process performed in a receiver, the decoding may be done using a belief propagation algorithm that is applied using the following equation:

$$C \cdot H^T = 0 \quad (3)$$

LDPC encoder 140 may operate such that the encoding is performed directly on the bits in the outer interleaved packets, in a process known as binary LDPC coding. Alternately, LDPC encoder 140 may operate on LPDC symbols, formed from groups of 2 or more bits, in a process referred to as non-binary LDPC coding. For example, sets of 2 bits may be grouped into LDPC symbols for encoding using a 4-ary LPDC coding process. As opposed to binary LDPC coding which is defined over the mathematical field GF(2), a non-binary LDPC code word is defined over GF(q), where q is greater than 2. It is important to note that equations (1) to (3) defined above also apply for non-binary LDPC coding only with I, C, G, and H defined over GF(q).

The LDPC encoded data stream is provided to an inner interleaver 150. The inner interleaver 150 performs a similar process as described for the outer interleaver 130. Inner interleaver 150 may use one of a number of known interleaving processes including, but not limited to, a fixed convolutional interleaving process or a fixed block interleaving process, where the process used and the pattern are known to both the transmitter and the receiver. In a preferred embodiment, outer interleaver 130 uses a convolutional interleaving process that is optimized to minimize the effects of long sequences of errors due to the transmission channel. The inner interleaver 150 uses a block interleaving process, including randomization of both individual bits as well as groups of bits in the data stream, which is optimized to minimize the effects of short burst errors due to the transmission channel. Inner interleaver 150 may include a memory for storing a portion of the incoming stream or a portion of the output interleaved stream in order to facilitate the interleaving process.

The error correction encoded data stream is provided to the symbol mapper 160. The symbol mapper 160 groups and arranges the bits in the error correction encoded data stream into a set of symbols. The symbol mapping is chosen based on the symbol constellation for the desires modulation scheme. Typically, modulation schemes employ constellation mapping based on PSK or QAM modulation. In a preferred embodiment, symbol mapper 160 groups and arranges the bits into symbols for use in a modulation scheme using QPSk, 16-QAM, or 64-QAM constellations. The mapping of bits to symbols may be performed based on a number of mapping schemes including, but not limited to, gray code mapping, double gray code mapping, and parity mapping. The further operation, including inventive aspects, of the LDPC encoder 140, outer interleaver 150, and symbol mapper 160 while described below. The traditional symbol mapping involves an n-bit constellation map for mapping to a QPSK or QAM symbol constellation as $2^n$. In a preferred embodiment, a group of m bits, where m is less than n, is mapped to a portion of QPSK or QAM symbol constellation map as $2^m$. The mapping of m bits is referred to as group mapping. The same group of m bits may also be interleaved prior to mapping in a process known as group mapping and group interleaving.

In addition to receiving and mapping the error correction encoded data stream, symbol mapper 160 also receives signals from training signal Inserter 165. Training signal inserter 165 generate special training signals used by the receiver to assist in the reception of the transmitted signal. Pilot signals are added, typically as a group of bits representing a symbol in the constellation map, in order to improve signal synchronization in the receiver. Pilot signals may also be used for training during transmission channel determination and equalization in the receiver. A transmission parameters signaling (TPS) signal may also be generated and inserted in addition to, in place of, one or more of the pilot signal. The TPS signal includes information for specifically identifying transmission properties, such as the transmitter location and modulation scheme. The TPS signals may assist the receiver during signal or channel switchovers, changes in parameters, or during initial signal acquisition. Symbol mapper 160 receives the pilot signals and TPS signals and maps them to locations in the symbol constellation map. It is important to note that the locations for the pilot signals and TPS signals are typically known to the receiver and are often determined based on the transmission standard used.

The stream of data, arranged as symbols, from the symbol mapper 160 is provided to the framer 170. Framer 170 groups the symbols in blocks having a constant length in terms of bits. For instance, for a modulation scheme employing QPSK, 16-QAM, and 64-QAM constellations, the blocks may contain 6048, 3024, or 1512 symbols per block respectively for each of the above mentioned constellations. Framer 170 may further group the blocks of symbols to form a frame containing 68 blocks. Framer 170 may also group a set of 4 frames into a superframe. Framer 170 groups the symbols into blocks, frames, and superframes in order to facilitate the transformation processing, such as fast Fourier transform processing, carried out as part of the OFDM modulation process.

Framer 170 may also convert the stream of data symbols from a serial signal into a set of parallel signals in preparation for OFDM modulation. The number of parallel streams is determined by parameters associated with the OFDM modulation process, such as the number of subcarriers in the output OFDM modulated signal. The data rate of each of the parallel signal data stream is related to the original data rate of the serial signal divided by the number of parallel signals generated. It is important to note that the serial to parallel conversion may be included in a block previous to framer 170, such as symbol mapper 160 or LDPC encoder 140. The conversion may also be performed by maintaining a serial signal and including timing indicators as multiplexes of the individual parallel data signals.

The framed blocks of data are provided to the OFDM modulator 180. OFDM modulator 180 performs a signal transformation, converting the blocks of symbols received in parallel in the time domain into an equivalent group of carriers, called subcarriers, containing modulated data in the frequency domain. In a preferred embodiment, the conversion is performed using an inverse fast Fourier transform algorithm. The output signal may contain either 2048 or 8096 subcarriers separated and spaced across a defined frequency range for a modulated channel. The number of carriers used may depend on the modulation format selected and the size of the frames or blocks used for the incoming signal. It is important to note that not all subcarriers may carry data because some subcarriers may be dedicated to providing a training signal or TPS signal. The conversion performed in OFDM modulator 180 creates a modulated signal containing OFDM symbols.

The OFDM symbols, representing the modulated data, are provided to the guard interval inserter 190. Guard interval inserter 190 replicates a portion of each of OFDM symbols and appends it to the same OFDM symbol. The copied portion of the OFDM symbol is typically referred to as the cyclic prefix. The cyclic prefix is a copy of the ending portion of an OFDM symbol that is appended to the beginning of the OFDM symbol. The cyclic prefix improves reception of the transmitted signal by eliminating or reducing the effects of multipath distortion from the transmission channel. Multipath distortion occurs due to the presence of buildings or obstructions creating signal reflections or due to the presence of multiple single frequency sources for the signal transmission. The portion of the OFDM symbol that may be copied as the cyclic prefix may vary. In a preferred embodiment, the portion forming the guard interval may be selected as one of $\frac{1}{4}$, $\frac{1}{8}$, $\frac{1}{16}$, and $\frac{1}{32}$ or the length of the original OFDM symbol.

The modulated digital signal is provided to the upconverter 195. Upconverter 195 converts the digital signal into an analog signal and converts the analog signal to a radio frequency (RF) signal suitable for signal transmission. Upconverter 195 typically includes a digital to analog converter, filters, mixers, and oscillators used to produce an RF signal that is transmitted over the air terrestrially or through a satellite link or, alternately transmitted using a hardwire interface such as co-axial cable. The upconverted signal is transmitted over the transmission channel to a receiver. Operation of a receiver using aspects of the present disclosure will be described in further detail below.

Control functions necessary for each of the blocks described above, such as switching operating modes, may be managed by a controller or processor included in each of the blocks. Alternatively, a central controller or processor, such as a microprocessor, not shown, may be included and connected to each of the blocks in order to provide mode switching and other control operations. Similarly any signal or data storage may be managed distributively with the inclusion of buffer memory in the blocks, or may be managed centrally with a memory circuit, not shown, controlled by a central controller, and interfaced to the blocks in FIG. 1.

Figure 2:
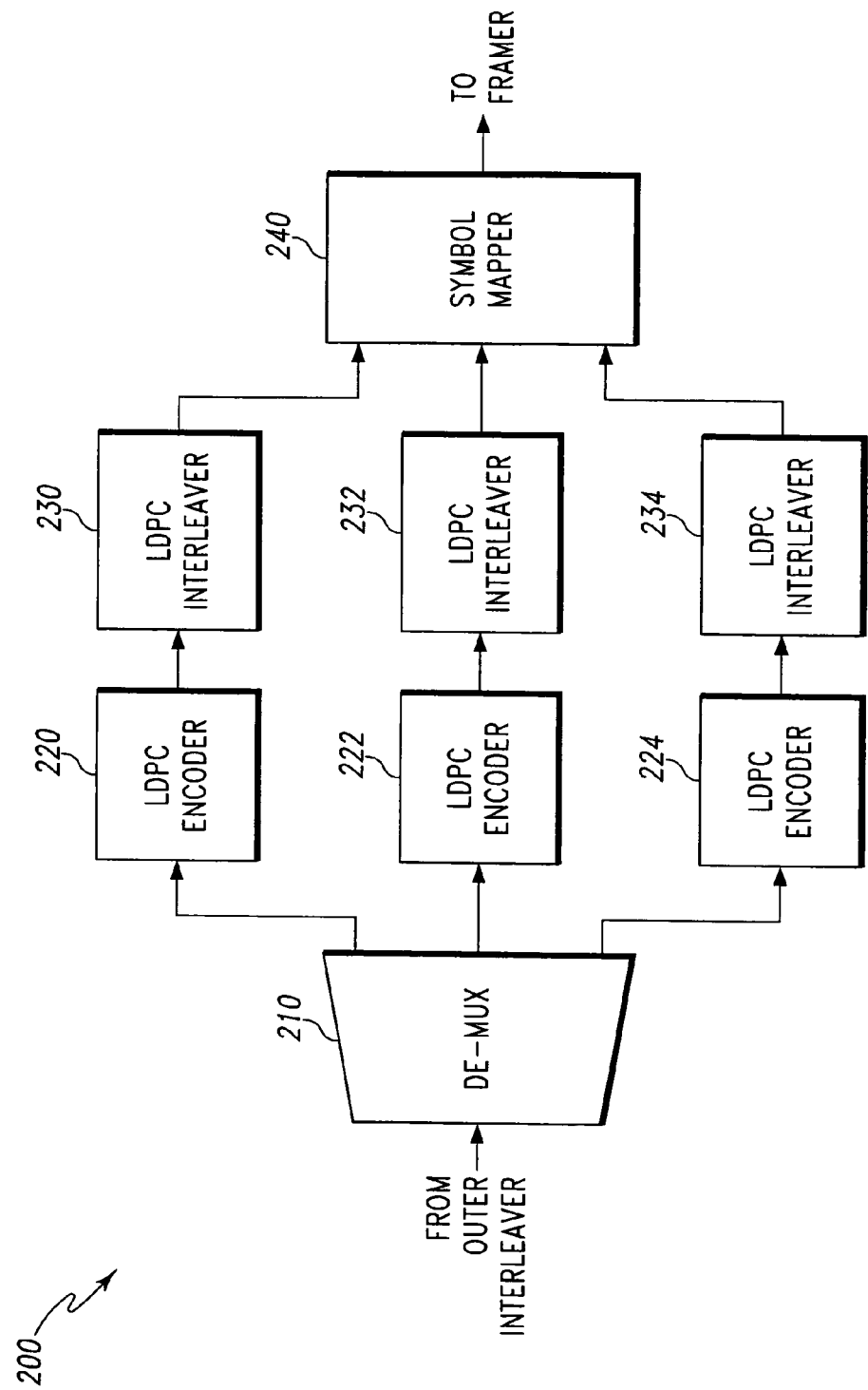
FIG. 2 is a block diagram of an embodiment of an LDPC encoder and symbol mapper according to aspects of the present disclosure.

Turning now to FIG. 2, a block diagram of an embodiment of an LDPC encoder and symbol mapper 200 using aspects of the present disclosure is shown. LDPC encoder and symbol mapper 200 may be used in place of LDPC encoder 140, outer interleaver 150, and symbol mapper 160 described in FIG. 1. The incoming data stream from an outer encoding and interleaving block is provided to de-mux 210. De-mux 210 supplies 3 outputs, with one output each connected to LDPC encoder 220, LDPC encoder 222, and LDPC encoder 224. The outputs of each of LDPC encoder 220, LDPC encoder 222, and LDPC encoder 224 are connected to LDPC interleaver 230, LDPC interleaver 232, and LDPC interleaver 234. The outputs of each of LDPC interleaver 230, LDPC interleaver 232, and LDPC interleaver 234 are connected to symbol mapper 240. The output of symbol mapper 240, representing the output of LDPC encoder and symbol mapper 200, is provided for further processing, such as to framing block 170 shown in FIG. 1.

The incoming data stream is provided to de-mux 210. De-mux 210 splits the incoming stream into parallel portions of the stream, creating one or more substreams. The splitting or de-multiplexing may be done on a bit by bit basis or, alternately, may be done based on a series of bits formed into groups. In a preferred embodiment, the de-mux 210 separates the incoming stream into 3 substreams. Further, de-mux 210 may split the substreams unequally based on, for instance, the encoding rate of one or more of the LDPC encoders 220-224. In a preferred embodiment, de-mux 210 may apportion the incoming stream based on placing 2 bits into a first portion representing a first parallel substream, placing the next 3 bits into a second portion representing a second parallel substream, and placing the next 4 bits into a third portion representing a third parallel substream. The next 2 bits are then placed into the first parallel stream and so on.

Each of the parallel streams is provided to either LDPC encoder 220, LDPC encoder 222, or LDPC encoder 224. Each encoder 220-224 may preferably be a non-binary encoder operating on LPDC symbols, such as a 4-ary LDPC encoder, where each LDPC symbol represents 2 bits in the parallel stream. Each encoder 220-224 may include a bit to LPDC symbol mapper for generation of the LDPC symbols. Each LDPC encoder 220-224 encodes the LDPC using LDPC encoding processes described above based on producing a set of k symbols at the output for every set of n symbols at the input. Each of the encoders 220-224 may operate using a different coding rate (k/n). In a preferred embodiment, the coding rate for LDPC encoder 220 is greater that the coding rate for LDPC encoder 222, which in turn is greater than the coding rate for LDPC encoder 224. Further, LDPC encoders 220-224 typically operate based on large blocks of data resulting from large values for n. For example, in a 64 QAM constellation and modulation in order to achieve an overall code rate of ½, the code rate for encoder 220 will be ¼, the code rate for encoder 222 will be ½ and the code rate for encoder 224 will be ¾. Similarly, in order to achieve an overall code rate of approximately ⅘, the code rate for encoder 220 will be ⅔ the code rate for encoder 222 will be ⅘ and the code rate for encoder 224 will be ⅚.

Each of the non-binary LDPC encoded data streams is provided to interleavers 230-234. Interleavers 230-234 separately interleave the data streams in a manner similar to that described for inner interleaver 150 in FIG. 1. However, due to the interaction with other blocks in LDPC encoder and symbol mapper 200, interleavers 230-234 include several important differences from traditional interleavers. A traditional interleaver typically receives all of the bits of data in bitstreams and performs a single interleaving based on individual bits. Traditional interleavers also often operate on a block size that is a function of the depth or size of the modulation constellation. The order or dimension of the elements in the interleavers 230-234 is equivalent to the order or dimension of LDPC encoders 220-224. In a preferred embodiment, each element in interleavers 230-234 is one LDPC symbol. Further, interleavers 230-234 interleave the data stream using block interleaving with the block size equal to the set of k symbols produced at the out of each respective LDPC encoder 220-224. As a result, interleavers 230-234 may be referred to as group interleavers. Each of the interleavers 230-234 may also include a memory for storing portions of the data stream in order facilitate the large block interleaving process.

Each of the interleaved encoded data streams is provided as a separate input to the symbol mapper 240. Symbol mapper 240 assigns bits from the received LDPC symbols in each of the interleaved encoded data streams based on the LDPC coding rate used for the particular interleaved encoded data stream, as well as intrinsic information associated with the symbol constellation map for the modulation format. As a result, certain bits from the encoded bitstreams are assigned to certain bit positions in the symbol constellation map in the symbol mapper 240. The bit positions are selected based on the intrinsic properties of the symbol constellation map and the LDPC encoding rates for each of the bitstreams.

The LDPC encoder and symbol mapper 200 preferably operate using a non-binary encoding process. The non-binary LDPC codes may be defined in a Galois Field (GF(4)). However, LDPC encoder and symbol mapper 200 may use a binary LDPC encoding process or a non-binary LPDC encoding process defined over a different field. It is important to note that non-binary LDPC codes can achieve performance very close to the Shannon capacity limit especially when the block length for the code is smaller than 10,000. Typically, non-binary LDPC codes designed in high order Galois fields GF(q) can achieve better performance than binary LDPC code when used for the same or shorter block size. The shorter code length and block size permitted by the use of non-binary LDPC codes can help to improve the transmission flexibility.

The use of LDPC coding, and in particular, non-binary LDPC coding, in conjunction with OFDM modulation, such as described above, offers an improvement in signal performance and coding efficiency. LDPC coding provides coding performance approaching the Shannon limit. The use of parallel non-binary LDPC coding, such as described in FIG. 2, and further including symbol mapping processes tailored to the LDPC coding of the portions of the bitstream overcome the inherent shortcomings for reception probabilities for certain bits in the symbol constellation map. The symbol mapping maps a set of bits from a first portion substream to a first region of a symbol constellation map and maps a set of bits from a second portion substream to a second region of the symbol constellation map to produce a set of symbols, overcoming the inherent inequity in bit reliability that occurs in portions of a typical higher order multi-symbol constellation map. As a result, structures such as the LDPC coder and symbol mapper described in FIG. 2 offer the benefit of improved overall coding performance and improved coding efficiency for a signal using higher order modulation formats.

Figure 3:
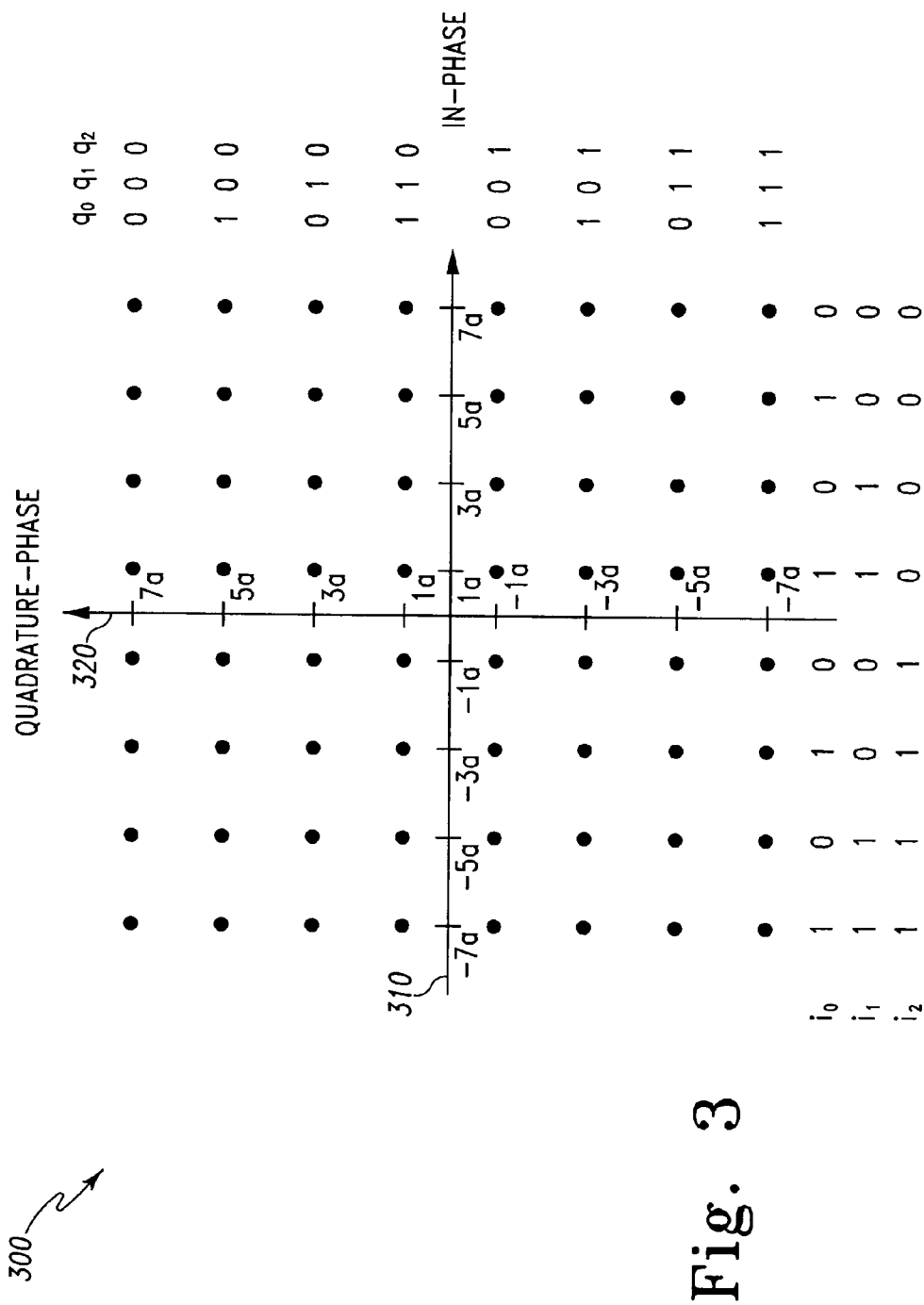
FIG. 3 is a diagram of an embodiment of a symbol constellation map according to aspects of the present disclosure.

Turning now to FIG. 3, a diagram illustrating an embodiment of a symbol constellation map 300 using aspects of the present disclosure is shown. In particular, symbol constellation map 300 represents a constellation map for a signal modulated using 64-QAM modulation. Symbol constellation map 300 shows a grid of symbol points oriented along both a horizontal in phase axis 310 and a vertical quadrature phase axis 320. The horizontal rows and vertical columns correspond to different values associated with a set of bits, i0, i1, and i2 along in phase axis 310 and a set of bits, q0, q1, and q2 along the quadrature phase axis 320. The 64-QAM constellation is formed by mapping a set of 6 bits, y0, y1, y2, y3, y4, and y5, to the points in symbol constellation map 300. Bits y0, y1, and y2 are assigned to the mapping bit positions i0, i1, and i2. Bits y3, y4, and y5 are assigned to the mapping bit positions q0, q1, and q2. The final symbol value is determined based on the value (0 or 1) of each of the original bits.

In the 64-QAM symbol constellation as shown in FIGS. 3, i0 and q0 are the least reliable bit positions, and the bit positions i1 and q1 have a higher reliability of data recovery in a receiver as compared to bit positions i0 and q0. Further, bit positions i2 and q2 have a higher reliability as compared to bit positions i1 and q1. The reliability for the bit positions is primarily determined by the allocation of the bits in the constellation and the Euclidean distance between symbols. The symbol constellation map 300 utilizes a bit to symbol pattern that employs non-gray coding for the bits associated with the in-phase axis 310, i0, i1, and i2, as well as non-gray coding for the bits associated with the quadrature phase axis 320, q0, q1, and q2. The use of a non-gray code mapping on or about each axis illustrated in FIG. 3 specifically allows for a de-mapping using only a one dimensional de-mapping process. In other words, the de-mapping process only needs to compute or determine values for bit positions i0, q0, i1, q1, i2, q2, using only the respective linear distance information for either the in-phase axis or the quadrature phase axis. In order to provide an improvement in performance, bit positions having lower reliability may be provided with bits from the LDPC encoded bitstream having the higher coding rate. For example, based on the constellation map in FIG. 3, bit i0 and bit q0 may be allocated from encoder 220 typically operating at the highest coding rate, bit i1 and bit q1 may be allocated from encoder 222 typically operating at the next highest coding rate, and bit i2 and bit q2 may be allocated from encoder 224 typically operating at the lowest coding rate.

Figure 4:
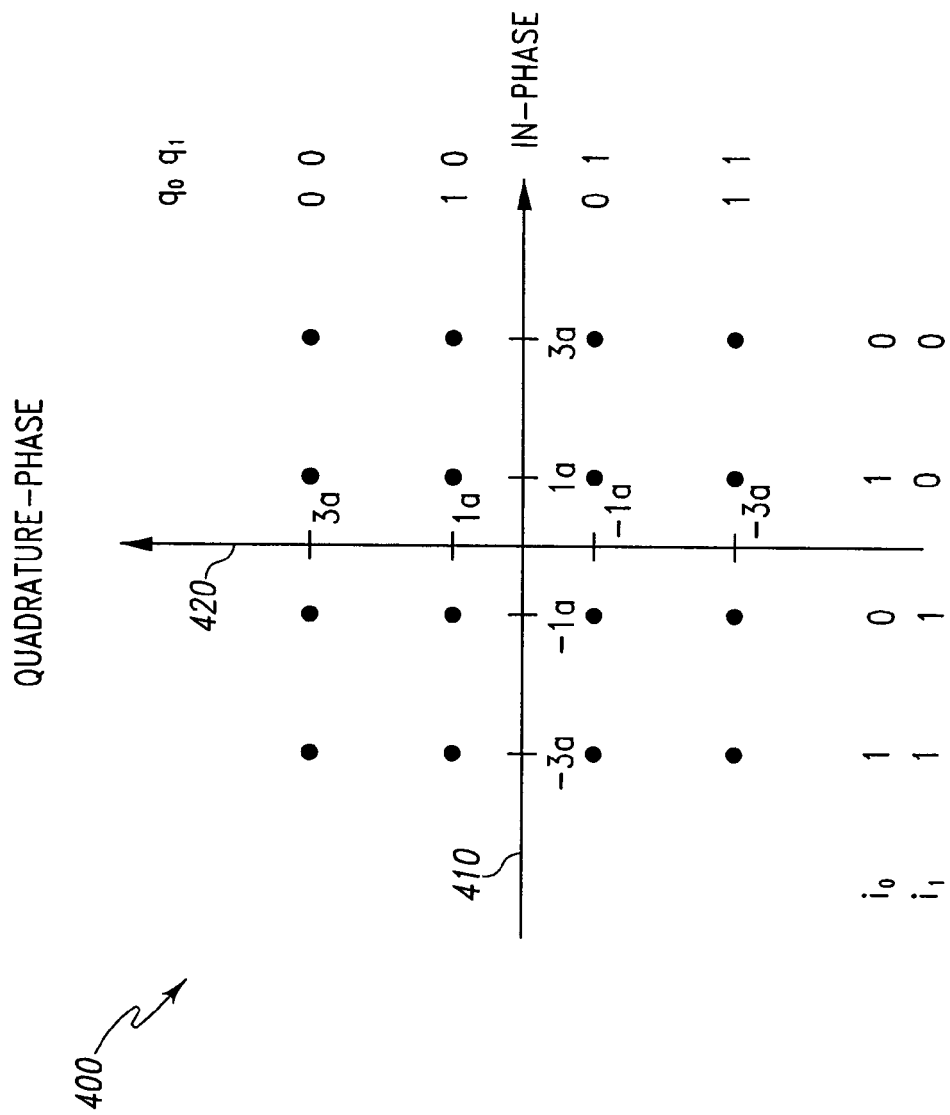
FIG. 4 is a diagram of another embodiment of a symbol constellation map according to aspects of the present disclosure.

Turning now to FIG. 4, a diagram illustrating an embodiment of a symbol constellation map 400 using aspects of the present disclosure is shown. In particular, symbol constellation map 400 represents a constellation map for a signal modulated using 16-QAM modulation. Symbol constellation map 400 shows a grid of symbol points oriented along both a horizontal in phase axis 410 and a vertical quadrature phase axis 420. The horizontal rows and vertical columns correspond to different values associated with a set of bits, i0 and i1 along in phase axis 410 and a set of bits, q0 and q1 along the quadrature phase axis 420. The 16-QAM constellation is formed by mapping a set of 4 bits, y0, y1, y2, and y3, to the points in symbol constellation map 400. Bits y0 and y1 are assigned to the mapping bit positions i0 and i1. Bits y3 and y4 are assigned to the mapping bit positions q0 and q1.

In the 16-QAM symbol constellation as shown in FIG. 4, i0 and q0 are the least reliable bit positions, and the bit positions i1 and q1 have a higher reliability as compared to bit positions i0 and q0. The 16-QAM symbol constellation shown in FIG. 4 also uses a non-gray code mapping similar to that described in FIG. 3. It is important to note that the 16-QAM modulation format may be implemented with only 2 LDPC encoders. As a result, LDPC encoder 224 and LDPC interleaver 234 are not necessary may remain unused during 16-QAM operation. For example, based on the constellation map in FIG. 4, bit i0 and bit q0 may be allocated from encoder 220 typically operating at the highest coding rate, bit i1 and bit q1 may be allocated from encoder 224 typically operating at the lowest coding rate.

Figure 5:
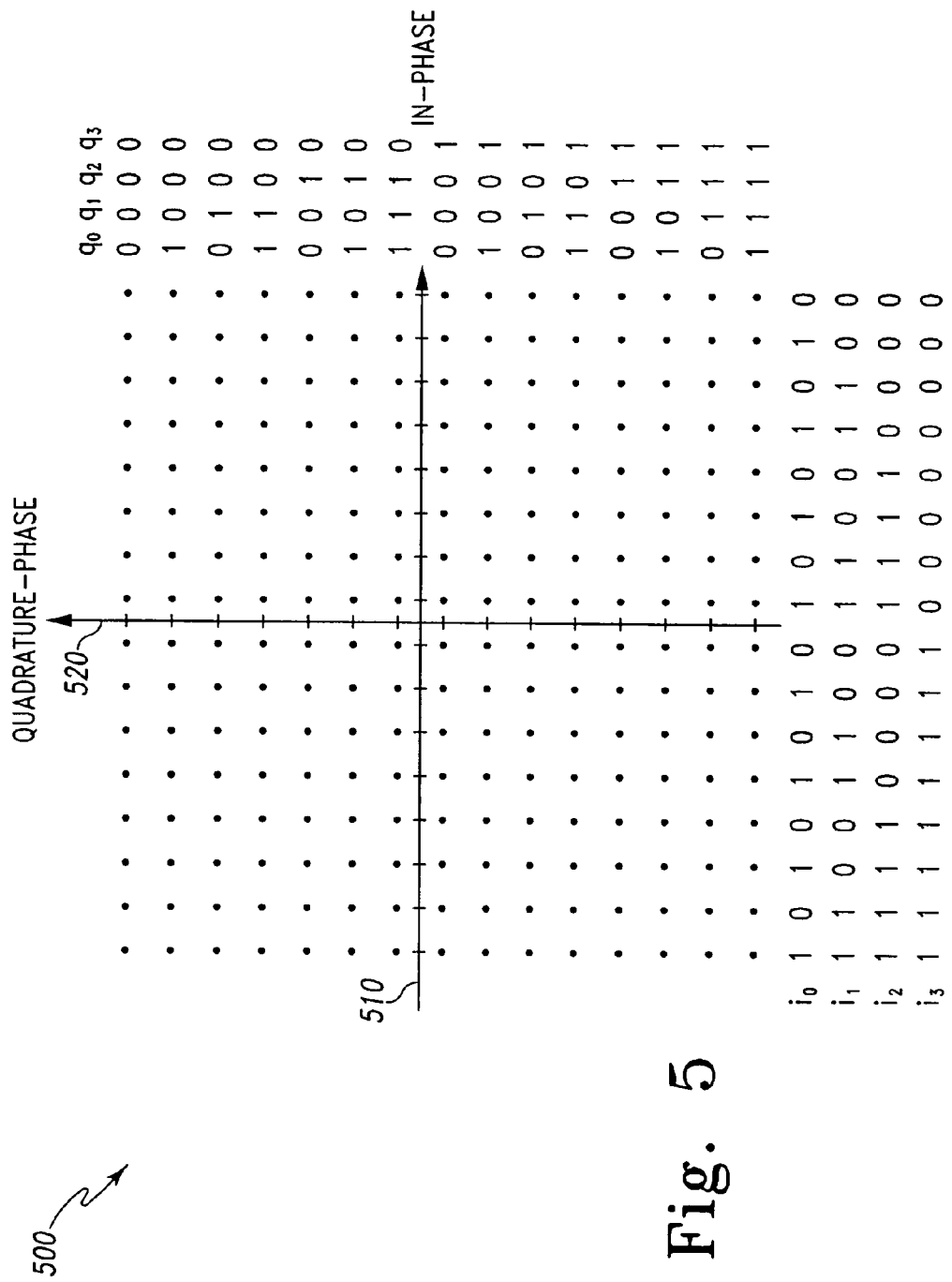
FIG. 5 is a diagram of a further embodiment of a symbol constellation map according to aspects of the present disclosure.

Turning now to FIG. 5, a diagram illustrating an embodiment of a symbol constellation map 500 using aspects of the present disclosure is shown. In particular, symbol constellation map 500 represents a constellation map for a signal modulated using 256-QAM modulation. Symbol constellation map 500 shows a grid of symbol points oriented along both a horizontal in phase axis 510 and a vertical quadrature phase axis 520. The horizontal rows and vertical columns correspond to different values associated with a set of bits, i0, i1, i2, and i3 along in phase axis 510 and a set of bits, q0, q1, q2, and q3 along quadrature phase axis 520. The 256-QAM constellation is formed by mapping a set of 8 bits, y0, y1, y2, y3, y4, y5, y6, and y7 to the points in symbol constellation map 500. Bits y0, y1, y2, and y3 are assigned to the mapping bit positions i0, i1, i2, and i3. Bits y4, y5, y6, and y7 are assigned to the mapping bit positions q0, q1, q2, and q3.

In the 256-QAM symbol constellation as shown in FIGS. 5, i0 and q0 are the least reliable bit positions, and the bit positions i1 and q1 have a higher reliability as compared to bit positions i0 and q0. Bits positions i2 and q2, and i3 and q3 have a higher reliability as compared to bit positions i1 and q1. The 256-QAM symbol constellation shown in FIG. 5 also uses a non-gray code mapping similar to that described in FIG. 3. It is important to note that the 256-QAM modulation format may be implemented using 2 consecutive LDPC symbols output from interleaver 234. As a result, LDPC encoder 224 outputs 2 symbols for every symbol output from LPDC encoder 220 and LDPC encoder 222. For example, based on the constellation map in FIG. 5, bit i0 and bit q0 may be allocated from encoder 220 typically operating the highest coding rate, bit i1 and bit q1 may be allocated from encoder 222 typically operating at the next highest coding rate, and bit i2, i3 and bit q2, q3 may be allocated from encoder 224 typically operating at the lowest coding rate.

As described above in FIG. 2, an important feature of the LDPC encoding and symbol mapping involves providing the proper bits for use in the symbol mapping. In one embodiment, the de-mux 210 produces 3 parallel output streams by equally apportioning the incoming stream. Each LDPC encoder 220-224 outputs a different length stream of block length k based on the same length input data set length n. Following interleaving in interleavers 230-234, a series of bits are provided to the symbol mapper 240. The symbol mapper 240 maps bits from the different bitstreams into locations in the symbol constellation map based on the reliabilities for the bits positions as described in FIG. 3, FIG. 4, and FIG. 5. In an alternative embodiment, the demux 210 produces 3 parallel output streams apportioned based the individual coding rates for each LDPC encoder 220-224. The remaining processing may be similar as described here. Apportioning the output streams based on the coding rate potentially reduces latency in the receiver due to delays associated with the transmission of portions of the original message due to the unequal coding rate.

Figure 6:
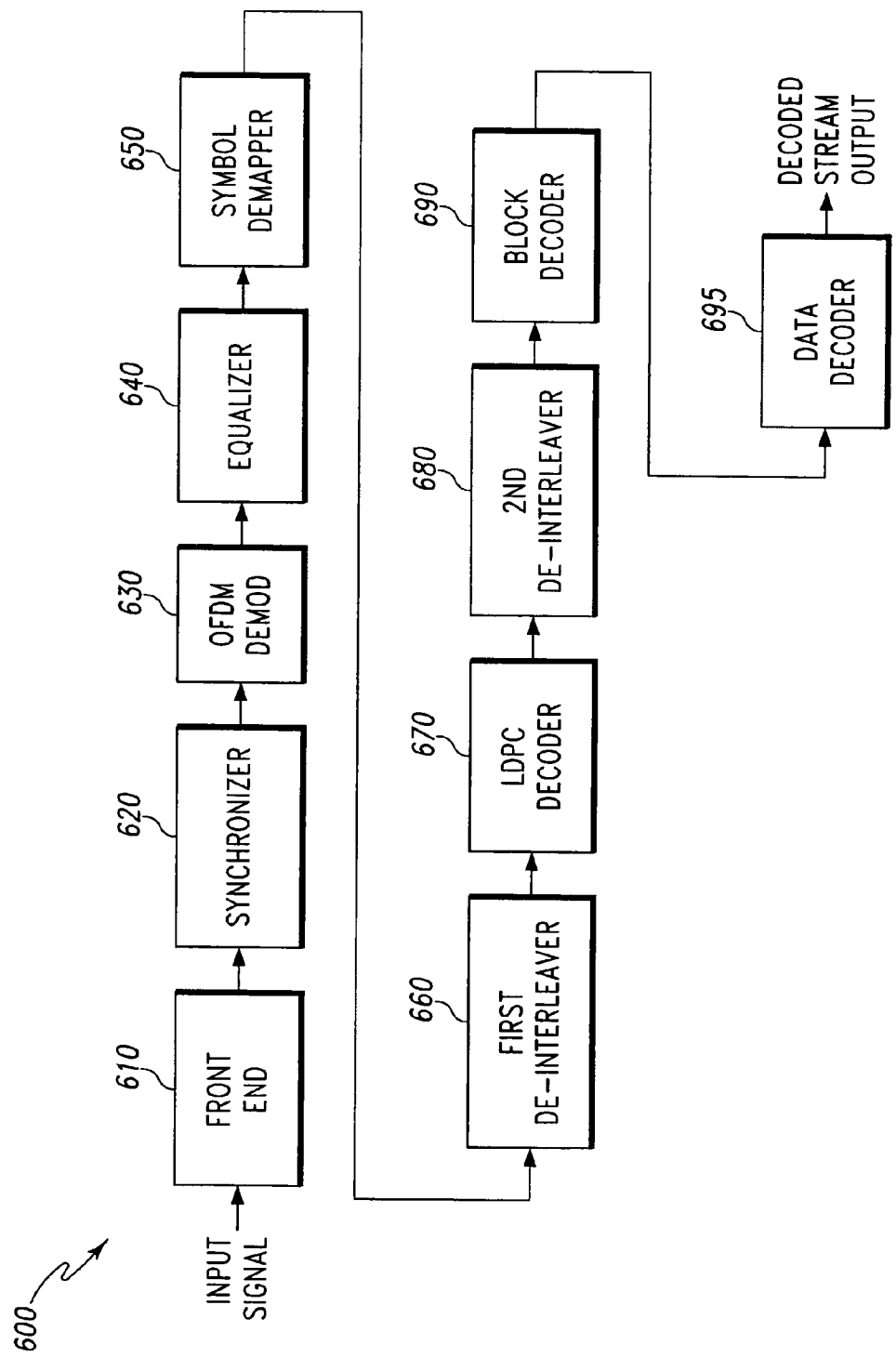
FIG. 6 is a block diagram of an embodiment of a receiver according to aspects of the present disclosure.

Turning to FIG. 6, a block diagram of an embodiment of a receiver 600 according to the present disclosure is shown. In general, receiver 600 is configured to receive OFDM transmissions and recover the baseband data from the transmissions. The received transmissions may conform to the DVB-T or DVB-H digital television standards or they may conform to any other suitable protocols or standard formats. Further, receiver 600 is capable of receiving signals transmitted using a concatenated encoding process, including for instance, both Reed-Solomon encoding and LDPC encoding. Receiver 600 includes front end 610, synchronizer 620, OFDM demodulator 630, equalizer 640, symbol demapper 650, first de-interleaver 660, LDPC decoder 670, second de-interleaver 680, Reed-Solomon block decoder 690, and data decoder 695, all arranged and connected in serial fashion.

Receiver 600 may be adapted to receive over the air broadcast transmissions using an antenna, not shown. Receiver 600 may also be adapted to receive a wireline broadcast transmission through a suitable interface, such as co-axial cable. It should be noted that receiver 600 may be embodied in hardware, software, or any suitable combination thereof. Additionally, receiver 600 may be integrated into other hardware and/or software. For example, OFDM receiver 600 may be part of an integrated television signal receiver and display device, a television receiver settop box, or a broadcast signal enabled personal computer. Further, it should be readily appreciated that various blocks of OFDM receiver 600 may be interconnected through various control signals, not shown, for the communication of various control settings between the blocks.

A suitable transmitted signal is received and input to front end 610. Front end 610 is configured to receive transmitted OFDM signals, select the desired OFDM signal, and generate time-domain samples or data. Front end 610 may include input signal conditioning elements such as tuning circuits, mixers, amplifiers, oscillators and filters. Front end 610 also includes an analog-to-digital converter (ADC).

The output signal from front end 610 is provided to synchronizer 620. Synchronizer 620 contains circuits for adjusting the relative signal position of the sampled time domain input signal from the front end for proper processing by OFDM demod 630. Synchronizer 620 may include, for example, a windowing circuit that multiplies the sampled time domain data by a window function such as a Hamming window, Hanning window, or the like. Synchronizer 620 may also include part, or all, of the signal processing for performing carrier signal synchronization or symbol timing synchronization.

The signal output from synchronizer 620 is provided to OFDM demod 630. OFDM demod 630 is configured to generate frequency-domain representations or data from the time-domain samples by performing FFT operations on blocks of the time-domain data. The size and complexity of the transform operation and the resulting size and complexity of the FFT processor may be primarily dependent upon the size of the fourier transform matrix used during transmission as described above. Additionally, alternate forms of transformation processes may exist and may be used in place of the FFT. Also, OFDM demod 630 removes any guard interval that may have been included with the OFDM signal. The guard interval is removed prior to performing the transform. The demodulated output signal is typically represented as a set of parallel signals in the form of modulated subcarriers. The demodulated signal may be provided by the OFDM demod 630 as a either a set of individual signals in parallel or as a single signal with the individual subcarrier signals multiplexed together.

The demodulated output signal from OFDM demod 630 is provided to equalizer 640. In general, equalizer 640 is configured to reduce the multi-path distortion effects of the transmission channel through which the OFDM signals have been transmitted. Equalizer 640 may adjust or change the amplitude or phase information associated with each or all of the sub-carriers in the demodulated OFDM signal. Equalizer 640 adjusts the amplitude or phase information based on information from computations and operations performed on the demodulated OFDM within equalizer including, but not limited to, channel estimation, and pilot. signal detection and processing.

The equalized output signal from equalizer 640 is provided to symbol de-mapper 650. Symbol de-mapper 650 determines symbol values at certain intervals of time for the incoming equalized OFDM signal. Additionally, after the symbol values are determined, the symbol values are mapped back into a set of bits. The de-mapping process is dependent upon the particular modulation format chosen for the signal, such as 16-QAM, 64-QAM, or 256-QAM, and also upon the particular constellation mapping used. The de-mapping in symbol de-mapper 650 typically matches the mapping operation performed during signal transmission. In a preferred embodiment, the de-mapping in symbol de-mapper 650 complies with the symbol constellation map shown in FIG. 3, FIG. 4, or FIG. 5. It is important to note that equalizer 640 and symbol de-mapper 650 may operate iteratively through a feedback connection between equalizer 640 and symbol de-mapper 650, not shown. The iterative feedback processing may improve the accuracy of the detected symbols and resulting data bits.

The signal output, representing a stream of data bits, from symbol de-mapper 650 is provided to first de-interleaver 660. The first de-interleaver 660 de-interleaves the stream of data bits prior to the first decoding process. The first de-interleaver typically reverses the interleaving performed in the last interleaving stage in the transmission system, such as inner interleaver 150 in FIG. 1. In a preferred embodiment, first de-interleaver 660 uses a block de-interleaving process that matches the interleaving map used for block interleaving by inner interleaver 150.

The output signal from first de-interleaver 660 is provided to LDPC decoder 670. LDPC decoder 670 groups portions of the incoming stream into coding blocks. The size of the coding block is typically equal to, or related to, the value k in the LDPC coding scheme. LDPC decoder may be capable of decoding bits in a binary LDPC decoding process, or symbols in a non-binary decoding process depending on the encoding process used in transmission. LDPC decoder 670 decodes the blocks of data using an iterative multistage error correction and propagation process. The process and structure includes circuitry for collecting and iterating portions of the block of data based on a set of parity check equations. The parity check equations used are the equations generated based on the encoding process at the transmitter. Each successive iteration improves the correction capabilities based on using the parity check equations. A set of final output values are provided after the LDPC decoder 670 determines that no additional errors in the uncoded output data exist or the number of iterations has exceeded a threshold number.

The output signal from LDPC decoder 670 is provided to second de-interleaver 680. The second de-interleaver 680 de-interleaves the stream of data bits following the first decoding and prior to the second decoding process. The second de-interleaver typically reverses the interleaving performed in the first interleaving stage in the transmission system, such as outer interleaver 130 in FIG. 1. In a preferred embodiment, second de-interleaver 680 uses a convolutional de-interleaving process that matches the interleaving map used for convolutional interleaving by outer interleaver 130.

The output signal from second de-interleaver 680 is provided to Reed-Solomon block decoder 690. Reed-Solomon block decoder decodes the bitstream using a Reed-Solomon decoding process. Reed-Solomon block decoder 680 detects and arranges the incoming stream into packets. Each packet typically contains 204 bytes along with 3 identification bytes. Reed-Solomon block decoder 680 decodes each packet using the parity bytes contained in the packets. The parity packets create syndromes that allow for detection and correction of a certain number of errors in the remaining bytes in the packet. In a preferred embodiment, Reed-Solomon block decoder 680 decodes a packet containing 204 bytes including 26 parity bytes and 188 message data bytes to produce an error corrected bitstream. It is important to note that a Reed-Solomon (204, 188) error correction process may correct up to 8 byte errors in the 188 message data bytes.

The error corrected output signal, grouped in packets, from the Reed-Solomon block decoder 690 is provided to data decoder 690. Data decoder 690 recovers the various program bitstreams containing audio, video, and/or data program material. Data decoder 690 may include circuits for regrouping the packets to form a transport stream, separating portions of the transport stream into program stream, decoding or decompressing the program streams to form uncompressed audio and video program content.

The output of data decoder 695 is typically connected to further downstream signal processing, not shown, for converting the audio, video or data content into a signal suitable for display or other related use. For example, the downstream signal processing may include circuits used to generate audio and video signals for display on a television.

In operation of receiver 600, front end 610 receives OFDM signals and generates time-domain data that is processed or synchronized by synchronizer 620. The time domain samples are provided to OFDM demod 630. OFDM demod 630 generates frequency-domain representative data from the time-domain that is then equalized or corrected for transmission channel impairments in equalizer 640. The equalized data is de-mapped and converted bits in a bit stream in symbol de-mapper 650. The bitstream is then error-correction decoded in a concatenated decoding arrangement including first de-interleaver 660, LDPC decoder 670, second de-interleaver 680, and Reed-Solomon block decoder 690 to generate a fully error corrected bitstream. The error corrected bitstream is decoded into one or program streams contain audio, video or data content, in data decoder 695 and provided for further downstream signal processing. Although not shown, additional feedback and control signals may be provided and connected between the various blocks. Further, Control functions necessary for each of the blocks described above, such as switching operating modes, may be managed by a controller or processor included in each of the blocks. Alternatively, a central controller or processor, such as a microprocessor, not shown, may be included and connected to each of the blocks in order to provide mode switching and other control operations. Similarly any signal or data storage may be managed distributively with the inclusion of buffer memory in the blocks, or may be managed centrally with a memory circuit, not shown, controlled by a central controller, and interfaced to the blocks.

Figure 7:
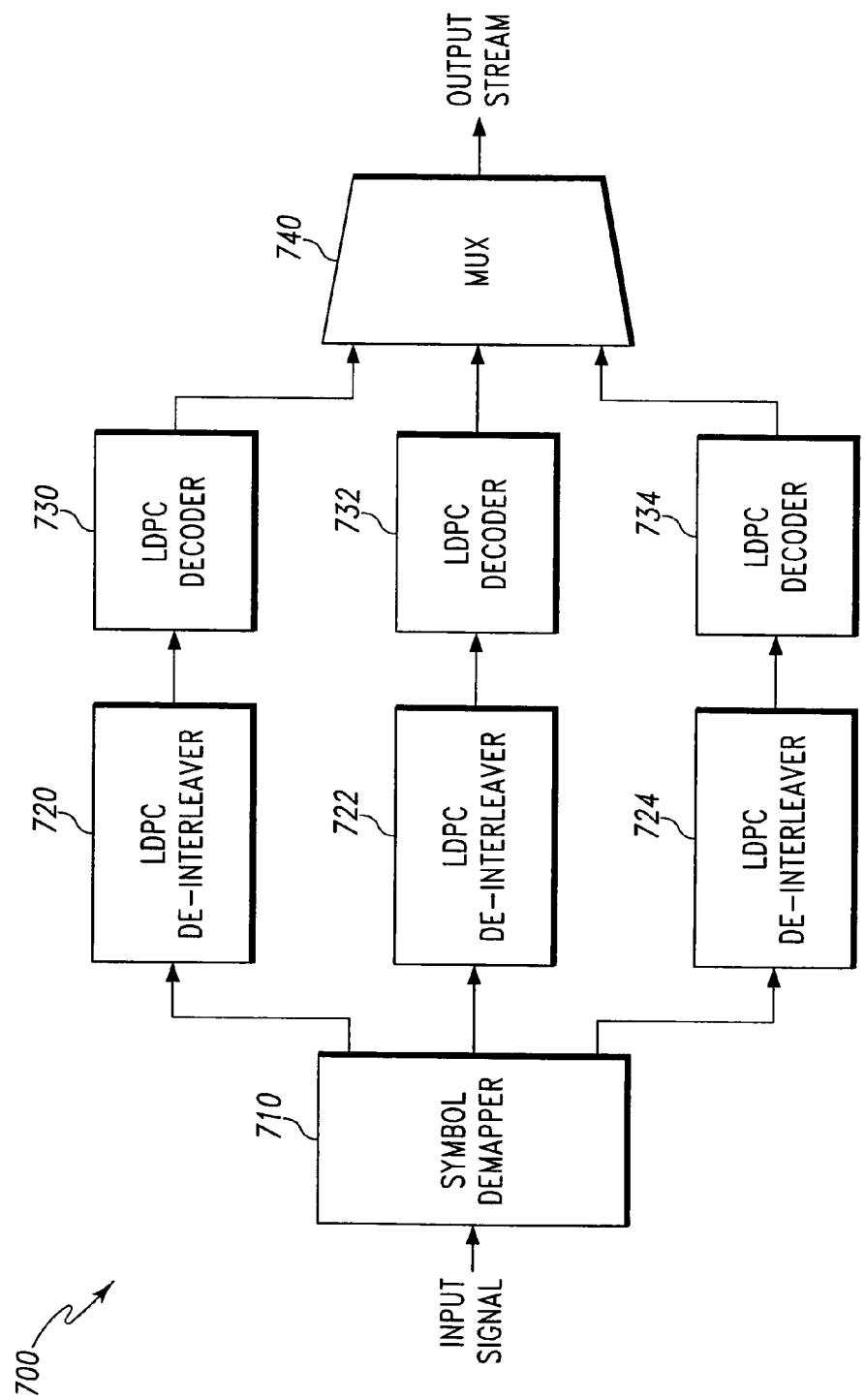
FIG. 7 is a block diagram of an embodiment of a symbol de-mapper and LDPC decoder according to aspects of the present disclosure.

Turning now to FIG. 7, a block diagram illustration an embodiment of a symbol de-mapper and LDPC decoder 700 using certain aspects of the present disclosure is shown. The symbol de-mapper and LDPC decoder 700 may be used in place of symbol de-mapper 650, first de-interleaver 660, and LDPC decoder 670 shown in FIG. 6. The incoming signal from OFDM demod and equalizer is provided to de-mapper 710. De-mapper 710 supplies 3 outputs, with one output each connected to LDPC de-interleaver 720, LDPC de-interleaver 722, and LDPC de-interleaver 724. The outputs of each of LDPC de-interleaver 720, LDPC de-interleaver 722, and LDPC de-interleaver 724 are connected to LDPC decoder 730, LDPC decoder 732, and LDPC decoder 734. The outputs of each of LDPC decoder 730, LDPC decoder 732, and LDPC decoder 734 are connected to mux 740. The output of mux 740, representing the output of symbol de-mapper and LDPC decoder 700, is provided on for further processing, such as to second de-interleaver 770 shown in FIG. 1.

The incoming signal is provided to de-mapper 710. De-mapper 710 decodes the incoming signal based on the symbol constellation that was transmitted. De-mapper 710 de-maps the symbols into three sets of bitstreams. The de-mapping may be done based on the reliabilities associated with the bit positions. In a preferred embodiment, the de-mapping is performed based on the group mapping performed in a transmission of the signal and based one of the symbol constellation maps shown in FIG. 3, FIG. 4, and FIG. 5. The output of the de-mapper 710 includes 3 parallel bitstreams, each stream having an appropriate LDPC encoding rate.

Each of the parallel bitstreams is provided to either LDPC de-interleaver 720, LDPC interleaver 722, or LDPC de-interleaver 724. Each de-interleaver 720-724 groups bits in the bitstream into LDPC symbols. In a preferred embodiment, each LDPC symbol includes 2 bits from the bitstream. Each de-interleaver 720-724 also de-interleaves the LDPC symbols based on the interleaving pattern used in the transmission, such as the group interleaving pattern used for interleavers 230-234 in FIG. 2. Each of the LDPC de-interleavers 720-724 may also include a memory for storing portions of the data stream in order facilitate the large block de-interleaving process.

Each of the de-interleaved parallel bitstreams is provided to either LDPC decoder 730, LDPC decoder 732, or LDPC decoder 734. Each LDPC decoder 730-734 is preferably a non-binary decoder operating on LPDC symbols, where each LDPC represents at least 2 bits in the parallel stream. For example, each LDPC decoder 730-734 may be a 4-ary LDPC decoder. Each LDPC decoder 730-734 typically operates based on large blocks of k symbols of incoming data.

Each LDPC decoder 730-734 decodes the LDPC symbols using LDPC decoding processes described above in FIG. 6 based on producing a set of n symbols of decoded data at the output for every set of k symbols at the input. Each of the decoders 730-734 may operate using a different coding rate (n,k). In a preferred embodiment, the coding rate for LDPC decoder 730 is greater, or higher, than the coding rate for LDPC decoder 732, which in turn is greater, or higher, than the coding rate for LDPC decoder 734. Each LDPC decoder 730-734 also includes an LPDC symbol to bit de-mapper for generation of an output LDPC decoded data stream.

Each of the decoded data streams is provided as a separate input to the mux 740. Mux 740 combines the bits from each of the decoded data streams to produce a single output LDPC decoded data stream. Mux 740 combines the bits based on the de-muxing process applied in the transmission, such as the de-muxing process used by de-mux 210 in FIG. 2.

It is important to note that symbol de-mapping and LDPC decoding may be performed iteratively. In an iterative configuration, the outputs of the symbol de-mapper and LDPC decoder may include soft output values. Soft output values are values that represent the reliability of the value for the bit, such as a log likelihood ratio value. The output soft values from the de-mapper 710 are provided to each of the LDPC de-coders 730-734 through de-interleavers 720-724. Following the decoding in LDPC decoders 730-734, the soft output values are fed back to the de-mapper 710 through a set of interleavers, not shown. The interleavers essentially re-interleave the soft output values in order to present the values in a proper format for de-mapper 710. The iterative process continues until the reliability values reach or exceed a reliability threshold or until the amount of time permitted for iteration has been exceeded. Following the iterative process, the last set of soft output values are converted to hard values for the bits and supplied to the mux 740.

Figure 8:
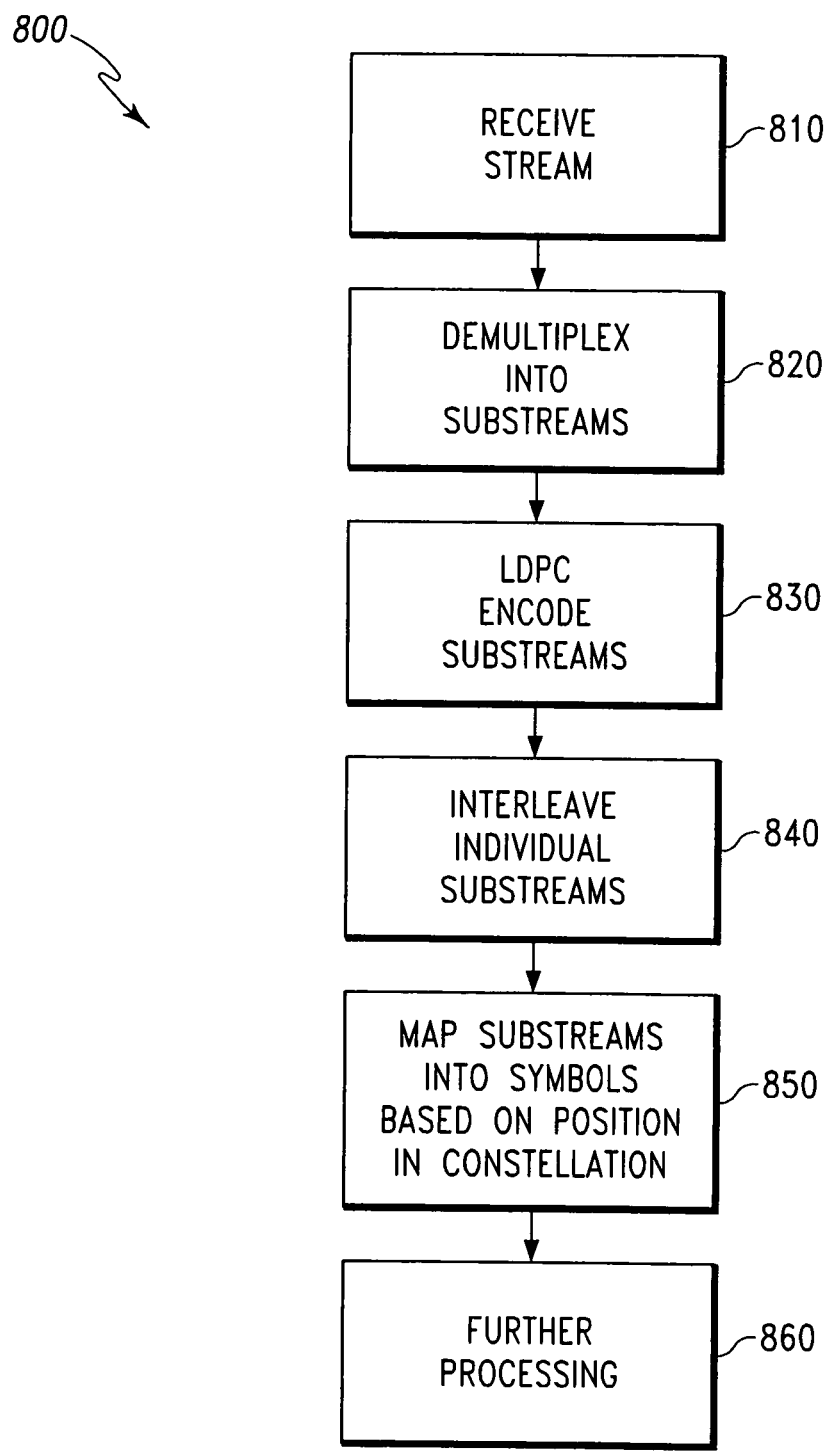
FIG. 8 is a flow chart of an embodiment of a process for LDPC encoding and symbol mapping according to aspects of the present disclosure.

Turning now to FIG. 8, a flow chart illustrating an embodiment of a process 800 for LPDC encoding and symbol mapping according to certain aspects of the present disclosure is shown. For purposes of example and explanation, the steps of process 800 will be described primarily with reference to LDPC encoder and symbol mapper 200 of FIG. 2. The steps of process 800 may be carried out as part of an overall process associated with a transmitter circuit, such as transmitter 100 shown in FIG. 1. Further, the steps of process 800 may be included as part of the overall operation and control of a broadcast transmission system, such as a DVB-T or DVB-H transmitter device. The steps of process 800 are exemplary only, and are not intended to limit the present disclosure in any manner.

At step 810, an incoming stream, such as a transport stream that has been processed using a first encoding and interleaving process, is received. The incoming stream may be provided as an input to de-multiplexer, such as de-mux 210. At step 820, the received incoming stream is de-multiplexed or separated into two or more substreams. Each of the substreams contains a sequential portion of the incoming stream.

The apportioning of the substreams may be equal or unequal portions equating to either the same or different relative sizes of lengths of the substreams.

Next at step 830, each of the substreams is individually encoded using an LDPC encoding process. The LDPC encoding process may be a binary encoding process or a non-binary encoding process. In a preferred embodiment, the bits in the substreams are grouped into LDPC symbols and encoded using a LDPC encoding process. Further, each substream is encoded using a different coding rate, where the succession of coding rates for each successive substream is monotonically decreasing.

Next, at step 840, each substream is group interleaved. In a preferred embodiment, each substream is group interleaved using a block interleaving process. The length or size of the block may be equal to the value of n used for the LDPC encoding process in step 830. Further, the element order may be equal the size or order of the LDPC symbol generated in step 830.

Next, at step 850, the bits or symbols from the interleaving at step 840 are group mapped into a symbol constellation map. Also, at step 850, if the encoding step 830 involved non-binary encoding, the symbols are decomposed back into a set of bits in preparation for group mapping. In a preferred embodiment, a symbol mapper, such as symbol mapper 240, maps a set of bits from each of the substreams into portions of a symbol constellation map, such as the constellation maps described in FIG. 3, FIG. 4, or FIG. 5. The group mapping at step 850 may utilize a bit to symbol pattern that employs gray coding for the bits associated with the in-phase axis, $i0$, $i1$, and $i2$, as well as gray coding for the bits associated with the quadrature phase axis, $q0$, $q1$, and $q2$. Further, in order to provide an improvement in performance, bit positions in the constellation map having lower reliability may be provided with bits from the LDPC encoded bitstream coded with the higher coding rate in step 830.

At step 860, the modulated signal, composed of symbols mapped based on a modulation constellation map, is provided for further processing. In a preferred embodiment, the modulated signal is provided for framing and further for OFDM modulation such as is described in FIG. 1.

Figure 9:
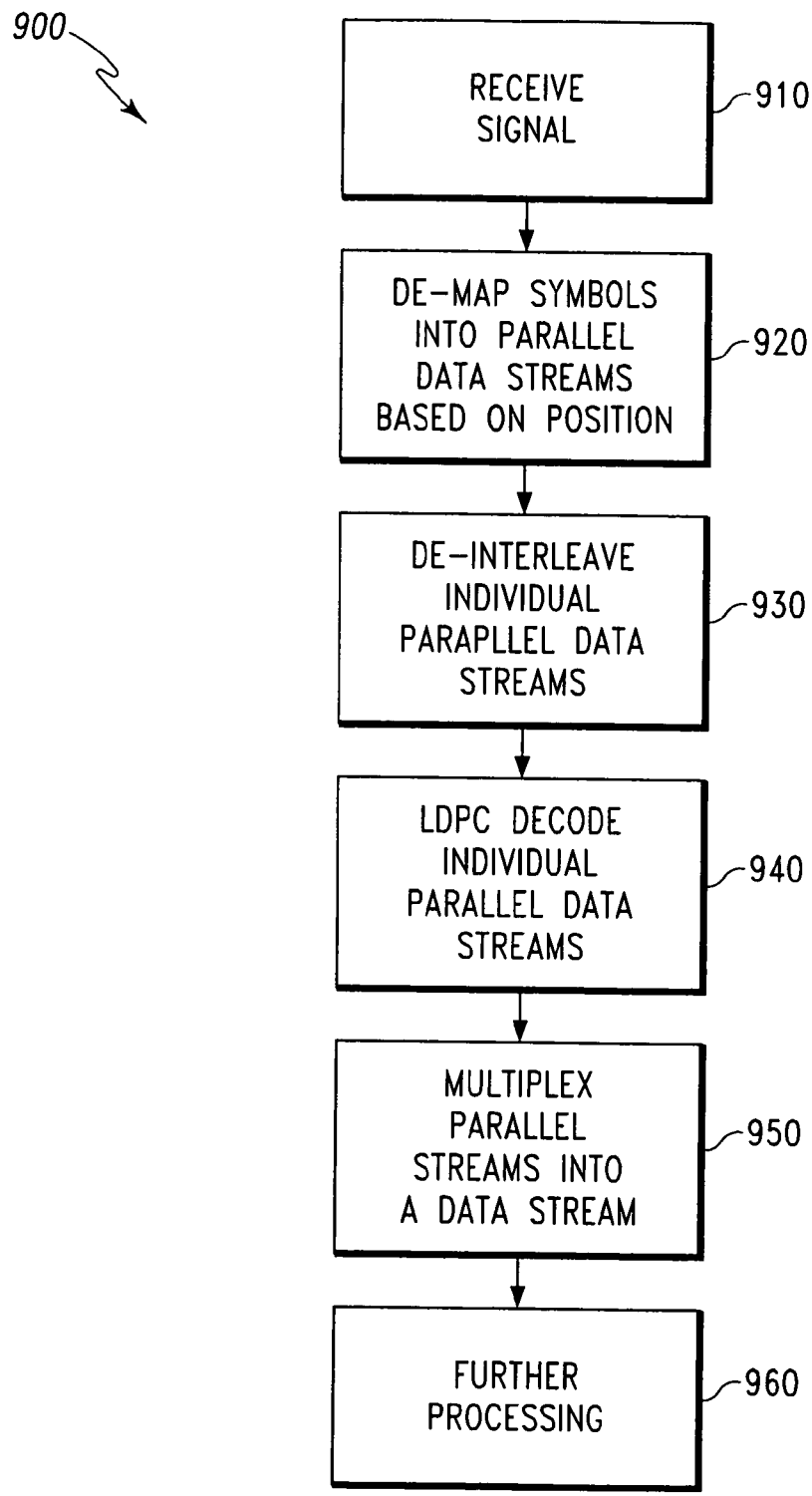
FIG. 9 is a flow chart of an embodiment of a process for symbol de-mapping and LDPC decoding according to aspects of the present disclosure.

Turning now to FIG. 9, a flow chart illustrating a process 900 for symbol demapping and LPDC decoding according to certain aspects of the present disclosure is shown. For purposes of example and explanation, the steps of process 900 will be described primarily with reference to symbol de-mapper and LDPC decoder 700 of FIG. 7. The steps of process 900 may be carried out as part of an overall process associated with a receiver circuit, such as receiver 600 shown in FIG. 6. Further, the steps of process 900 may be included as part of the overall operation and control of receiver for receiving a broadcast transmission, such as DVB-T or DVB-H. The steps of process 900 are exemplary only, and are not intended to limit the present disclosure in any manner.

At step 910, an incoming signal, composed of a bitstream of encoded symbols of data, is received. The incoming signal may be provided as an input to de-mapper, such as symbol de-mapper 710. At step 920, symbols in the received signal are detected and the symbols are de-mapped into a series of bits in several bitstreams. The de-mapping at step 920 is performed based on the established symbol to bit group mapping used during signal transmission. In a preferred embodiment, the de-mapping is based on the symbol constellation map shown in FIG. 3, FIG. 4, or FIG. 5. Each of the bitstreams contains bits that have been encoded using a specified code rate for an LDPC encoding process. It is important to note that each of the code rates may be different.

Next at step 930, each of the parallel bitstreams is individually de-interleaved. The de-interleaving is performed based on the group interleaving pattern used during the signal transmission, such as the interleaving in step 830 in FIG. 8. The de-interleaving at step 930 may also includes a bit to symbol grouping to create LDPC symbols.

Next, at step 940, each of the de-interleaved streams of LDPC bits or symbols is decoded using an LDPC decoding process. The LDPC decoding process may be a binary encoding process or a non-binary encoding process. In a preferred embodiment, each of the substreams is decoded using a LDPC decoding process. Further, each substream is decoded using a different coding rate established during signal transmission, where the succession of coding rates for each successive substream is monotonically decreasing. The LDPC decoding step 940 may also include mapping symbols, such as LDPC symbols, to bits in order to produce a set of bitstreams containing decoded bits.

Next, at step 950, the streams of decoded bits are combined to form a single stream of LDPC decoded bits. The combination of the streams may be performed using an equal multiplexing process, such as combining each consecutive bit from each of the streams. The combination may also be performed using a weighted multiplexing process. The weighted multiplexing process may be based on the coding rates from decoding step 940 for each of the substreams of data.

At step 960, the LDPC decoded signal is provided for further processing. In a preferred embodiment, the LDPC decoded signal is provided for further de-interleaving, Reed-Solomon decoding, and data decoding such as is described in FIG. 6.

The above embodiments describe a coded modulation signal transmission scheme using LDPC coding in conjunction with OFDM modulation and further in conjunction with a block coding process such as Reed-Solomon coding. In particular, embodiments describe the use of parallel non-binary LDPC coding, such as 4-ary LDPC coding, for separate portions of a bitstream and symbol mapping processes tailored to the LDPC coding of the portions of the bitstream. The symbol mapping maps a set of bits from a first portion substream to a first region of a symbol constellation map and maps a set of bits from a second portion substream to a second region of the symbol constellation map to produce a set of symbols, overcoming the inherent inequity in bit reliability that occurs in portions of a typical higher order multi-symbol constellation map. The symbol mapping processes described include, but are not limited to, 16-QAM, 64-QAM, and 256-QAM modulation constellations. Implementation of one or more aspects of the embodiments offers the benefit of improved overall coding performance and improved coding efficiency for a signal using higher order modulation formats.

The embodiments above describe an apparatus and a method for transmitting signals. The apparatus includes encoding and mapping circuits. The apparatus includes a demultiplexer that receives a stream of data arranged in bits and produces a first substream of data containing a portion of the stream of data and a second substream of data containing a second portion of the stream of data, an encoder that is coupled to the demultiplexer that encodes the first substream using a low density parity check coding process at a first encoding rate, another encoder that is coupled to the demultiplexer that encodes the second substream using a low density parity check coding process at a second encoding rate, as well as a symbol mapper that is coupled to the two encoders that maps a set of bits from the first encoded substream to a first region of a symbol constellation map and maps a set of bits from the second encoded substream to a second region of the symbol constellation map to produce a set of symbols. The apparatus may alternately group bits in the first substream into a first set of code symbols and group bits in the second substream into a second set of code symbols. The apparatus may then encode the first set of code symbols using a non-binary low density parity check coding process and encode the second set of code symbols using a non-binary low density parity check coding process and may also encode using a first encoding rate that is greater than the second encoding rate. The demultiplexer may also produce a first substream of data containing a smaller portion of the stream of data than the second substream of data. The smaller portion of the stream of data contained in the first substream of data may be based on an encoding rate of the first encoder. The symbol mapper may also map the set of bits from the first encoded substream and the set of bits from the second encoded substream based on the encoding rate of the first encoder and the encoding rate of the second encoder. The symbol mapper may also operate to map bits based on the encoding rates such that the bits mapped to the first region have a higher reliability of data recovery and the bits mapped to the second region have a lower reliability of data recovery. The symbol mapper may use a non-gray scale coding about an axis of a constellation map. The apparatus may also include an interleaver that is coupled to one encoder and also to the symbol mapper that interleaves the first substream using a block interleaving process, and another interleaver that is coupled to another encoder and also coupled to the symbol mapper that interleaves the second substream using a block interleaving process. Finally, the apparatus may be used in an OFDM signal transmission system, and the symbol mapper may map the bits into modulation symbols using at least one of 16 QAM, 32, QAM, 64 QAM, 256 QAM constellation map.

A method is also described for transmitting signals using an encoding and mapping process. The process includes demultiplexing a stream of data bits into a first substream containing a first portion of the stream of data bits and a second substream containing a second portion of the stream of data bits, followed by encoding the first substream and the second substream using a low density parity check coding process, and followed by mapping a set of bits from the first encoded substream to a first region of a symbol constellation map and a set of bits from the second coded substream to a second region of the symbol constellation map. The method may also include grouping bits in the first substream and the second substream into sets of code symbols. The encoding process may include encoding using a non-binary low density parity check coding process, or may alternately include encoding the first substream at an encoding rate that is greater than the encoding rate for the second substream. The first substream may contain a smaller portion of the stream of data than the second substream of data. The smaller portion of the stream of data contained in the first substream of data is based on an encoding rate for the first substream. The mapping may be based on an encoding rate of the first substream and an encoding rate of the second substream. The bits mapped to the first region may, as a result, have a higher reliability of data recovery and the bits mapped to the second region may, as a result, have a lower reliability of data recovery. The mapping may map bits into modulation symbols using a non-gray scale coding about an axis of the symbol constellation map. The mapping may also allow mapping the bits into modulation symbols using at least one of a 16 QAM, 32, QAM, 64 QAM, 256 QAM constellation map. The method may also include block interleaving the first substream and the second substream.

Finally, an apparatus is described that implements the functions of demultiplexing a stream of data bits into a first substream containing a first portion of the stream of data bits and a second substream containing a second portion of the stream of data bits, followed by encoding the first substream and the second substream using a low density parity check coding process, and followed by mapping a set of bits from the first encoded substream to a first region of a symbol constellation map and a set of bits from the second coded substream to a second region of the symbol constellation map. The method may also include grouping bits in the first substream and the second substream into sets of code symbols. The encoding process may include encoding using a non-binary low density parity check coding process, or may alternately include encoding the first substream at an encoding rate that is greater than the encoding rate for the second substream. The first substream may contain a smaller portion of the stream of data than the second substream of data. The smaller portion of the stream of data contained in the first substream of data is based on an encoding rate for the first substream. The mapping may be based on an encoding rate of the first substream and an encoding rate of the second substream. The bits mapped to the first region may, as a result, have a higher reliability of data recovery and the bits mapped to the second region may, as a result, have a lower reliability of data recovery. The mapping may map bits into modulation symbols using a non-gray scale coding about an axis of the symbol constellation map. The mapping may also allow mapping the bits into modulation symbols using at least one of a 16 QAM, 32, QAM, 64 QAM, 256 QAM constellation map. The method may also include block interleaving the first substream and the second substream. The apparatus may be used in an OFDM signal transmission system, and may be implemented using any means as described herein. The apparatus may also be implemented in one or more integrated circuits. Some or all of the functional operation may also be realized using microprocessor, microcontroller, or computer type devices running software or firmware.

While the above described embodiments may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents and alternatives falling within the scope of the disclosure as defined by the following appended claims.

The invention claimed is:

1. A method for transmitting signals, comprising the steps of:
   demultiplexing a stream of data bits into a first substream containing a first portion of the stream of data bits and a second substream containing a second portion of the stream of data bits, the first substream of data containing a smaller portion of the stream of data than the second substream of data;
   encoding the first substream and the second substream using a low density parity check coding process; and
   mapping a set of bits from the first encoded substream to a first region of a symbol constellation map and a set of bits from the second encoded substream to a second region of the symbol constellation map.

2. The method of claim 1, further comprising grouping bits in the first substream and the second substream into sets of code symbols.

3. The method of claim 1, wherein the step of encoding includes encoding using a non-binary low density parity check coding process.

4. The method of claim 1, wherein the step of encoding includes encoding the first substream at an encoding rate that is greater than the encoding rate for the second substream.

5. The method of claim 1, wherein the smaller portion of the stream of data contained in the first substream of data is based on an encoding rate for the first substream.

6. The method of claim 1, wherein the step of mapping the set of bits from the first encoded substream and the set of bits from the second encoded substream is based on an encoding rate of the first substream and an encoding rate of the second substream.

7. The method of claim 1, wherein the bits mapped to the first region have a higher reliability of data recovery and the bits mapped to the second region have a lower reliability of data recovery.

8. The method of claim 1, wherein the step of mapping includes mapping bits into modulation symbols using a non-gray scale coding about an axis of the symbol constellation map.

9. The method of claim 1, further comprising the step of block interleaving the first substream and the second substream.

10. The method of claim 1, wherein the step of mapping includes mapping the bits into modulation symbols using at least one of a 16 QAM, 32, QAM, 64 QAM, 256 QAM constellation map.

11. An apparatus for transmitting signals comprising:
a demultiplexer that receives a stream of data arranged in bits and produces a first substream of data containing a portion of the stream of data and a second substream of data containing a second portion of the stream of data, the first substream of data containing a smaller portion of the stream of data than the second substream of data;
a first encoder, coupled to the demultiplexer, that encodes the first substream using a low density parity check coding process at a first encoding rate;
a second encoder, coupled to the demultiplexer, that encodes the second substream using a low density parity check coding process at a second encoding rate; and
a symbol mapper, coupled to the first encoder and the second encoder, that maps a set of bits from the first encoded substream to a first region of a symbol constellation map and maps a set of bits from the second encoded substream to a second region of the symbol constellation map to produce a set of symbols.

12. The apparatus of claim 11, wherein the first encoder groups bits in the first substream into a first set of code symbols and wherein the second encoder groups bits in the second substream into a second set of code symbols.

13. The apparatus of claim 12 wherein the first encoder encodes the first set of code symbols using a non-binary low density parity check coding process and wherein the second encoder encodes the second set of code symbols using a non-binary low density parity check coding process.

14. The apparatus of claim 11, further comprising:
a first interleaver, coupled to the first encoder and the symbol mapper, that interleaves the first substream using a block interleaving process; and
a second interleaver, coupled to the second encoder and the symbol mapper, that interleaves the second substream using a block interleaving process.

15. A method for transmitting signals, comprising the steps of:
demultiplexing a stream of data bits into a first substream containing a first portion of the stream of data bits and a second substream containing a second portion of the stream of data bits;
encoding the first substream and the second substream using a low density parity check coding process; and
mapping a set of bits from the first encoded substream to a first region of a symbol constellation map and a set of bits from the second encoded substream to a second region of the symbol constellation map, wherein the step of mapping the set of bits from the first encoded substream and the set of bits from the second encoded substream is based on an encoding rate of the first substream and an encoding rate of the second substream.

16. An apparatus for transmitting signals comprising:
a demultiplexer that receives a stream of data arranged in bits and produces a first substream of data containing a portion of the stream of data and a second substream of data containing a second portion of the stream of data;
a first encoder, coupled to the demultiplexer, that encodes the first substream using a low density parity check coding process at a first encoding rate;
a second encoder, coupled to the demultiplexer, that encodes the second substream using a low density parity check coding process at a second encoding rate; and
a symbol mapper, coupled to the first encoder and the second encoder, that maps a set of bits from the first encoded substream to a first region of a symbol constellation map and maps a set of bits from the second encoded substream to a second region of the symbol constellation map to produce a set of symbols, the symbol mapper mapping the set of bits from the first encoded substream and the set of bits from the second encoded substream based on an encoding rate of the first substream and an encoding rate of the second substream.

17. An apparatus for transmitting signals, comprising:
means for demultiplexing a stream of data bits into a first substream containing a first portion of the stream of data bits and a second substream containing a second portion of the stream of data bits, the first substream of data containing a smaller portion of the stream of data than the second substream of data;
means for encoding the first substream and the second substream using a low density parity check coding process; and
means for mapping a set of bits from the first encoded substream to a first region of a symbol constellation map and a set of bits from the second encoded substream to a second region of the symbol constellation map.

18. An apparatus for transmitting signals, comprising:
means for demultiplexing a stream of data bits into a first substream containing a first portion of the stream of data bits and a second substream containing a second portion of the stream of data bits;
means for encoding the first substream and the second substream using a low density parity check coding process; and
means for mapping a set of bits from the first encoded substream to a first region of a symbol constellation map and a set of bits from the second encoded substream to a second region of the symbol constellation map, wherein the step of mapping the set of bits from the first encoded substream and the set of bits from the second encoded substream is based on an encoding rate of the first substream and an encoding rate of the second substream.

* * * * *